United States Patent
Colbert et al.

(10) Patent No.: US 7,435,622 B2
(45) Date of Patent: Oct. 14, 2008

(54) HIGH PERFORMANCE REWORKABLE HEATSINK AND PACKAGING STRUCTURE WITH SOLDER RELEASE LAYER AND METHOD OF MAKING

(75) Inventors: John Lee Colbert, Byron, MN (US); Mark Kenneth Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/876,095

(22) Filed: Oct. 22, 2007

(65) Prior Publication Data

US 2008/0044949 A1 Feb. 21, 2008

Related U.S. Application Data

(62) Division of application No. 11/316,264, filed on Dec. 22, 2005, now Pat. No. 7,342,306.

(51) Int. Cl.
*H01L 21/00* (2006.01)

(52) U.S. Cl. .......................... 438/118; 438/119; 438/120

(58) Field of Classification Search .......... 438/118–120
See application file for complete search history.

(56) References Cited

U.S. PATENT DOCUMENTS

| | | | | | |
|---|---|---|---|---|---|
| 4,012,770 | A | * | 3/1977 | Pravda et al. ................ | 257/715 |
| 5,631,799 | A | * | 5/1997 | Sayka ........................... | 361/103 |
| 6,084,775 | A | * | 7/2000 | Bartley et al. ................ | 361/705 |
| 6,490,160 | B2 | * | 12/2002 | Dibene et al. ................ | 361/700 |
| 7,002,247 | B2 | * | 2/2006 | Mok et al. ................... | 257/713 |
| 7,072,183 | B2 | * | 7/2006 | Lee et al. ..................... | 361/704 |
| 7,142,430 | B2 | * | 11/2006 | Lee et al. ..................... | 361/719 |
| 7,180,179 | B2 | * | 2/2007 | Mok et al. ................... | 257/714 |
| 7,342,306 | B2 | * | 3/2008 | Colbert et al. ............... | 257/712 |
| 7,365,978 | B2 | * | 4/2008 | Chen et al. ................... | 361/697 |
| 2002/0021556 | A1 | * | 2/2002 | Dibene et al. ................ | 361/704 |
| 2002/0080583 | A1 | | 6/2002 | Prasher et al. | |
| 2004/0188064 | A1 | * | 9/2004 | Upadhya et al. ............ | 165/80.3 |
| 2004/0261988 | A1 | * | 12/2004 | Sauciuc et al. .............. | 165/185 |
| 2005/0068725 | A1 | * | 3/2005 | Houle et al. ................. | 361/688 |
| 2005/0280128 | A1 | * | 12/2005 | Mok et al. ................... | 257/678 |
| 2005/0280162 | A1 | * | 12/2005 | Mok et al. ................... | 257/778 |
| 2006/0232928 | A1 | * | 10/2006 | Vinson et al. ................ | 361/687 |
| 2006/0244118 | A1 | * | 11/2006 | Roberts et al. .............. | 257/686 |
| 2007/0054105 | A1 | * | 3/2007 | Hsiao ....................... | 428/292.1 |
| 2007/0068173 | A1 | * | 3/2007 | Sauciuc et al. ................ | 62/3.3 |
| 2007/0090737 | A1 | * | 4/2007 | Hu et al ........................ | 313/11 |
| 2007/0134948 | A1 | * | 6/2007 | Brodsky et al. ............... | 439/66 |
| 2007/0145574 | A1 | * | 6/2007 | Colbert et al. ............... | 257/721 |
| 2007/0201210 | A1 | * | 8/2007 | Chow et al. ................. | 361/704 |
| 2008/0044949 | A1 | * | 2/2008 | Colbert et al. ............... | 438/118 |

* cited by examiner

*Primary Examiner*—Laura M Schillinger
(74) *Attorney, Agent, or Firm*—Joan Pennington

(57) ABSTRACT

A method of making and a high performance reworkable heatsink and packaging structure with solder release layer are provided. A heatsink structure includes a heatsink base frame. A selected one of a heatpipe or a vapor chamber, and a plurality of parallel fins are soldered to the heatsink base frame. A solder release layer is applied to an outer surface of the heatsink base frame. The solder release layer has a lower melting temperature range than each solder used for securing the selected one of the heatpipe or the vapor chamber, and the plurality of parallel fins to the heatsink base frame. After the solder release layer is applied, the heatpipe or the vapor chamber is filled with a selected heat transfer media.

7 Claims, 5 Drawing Sheets

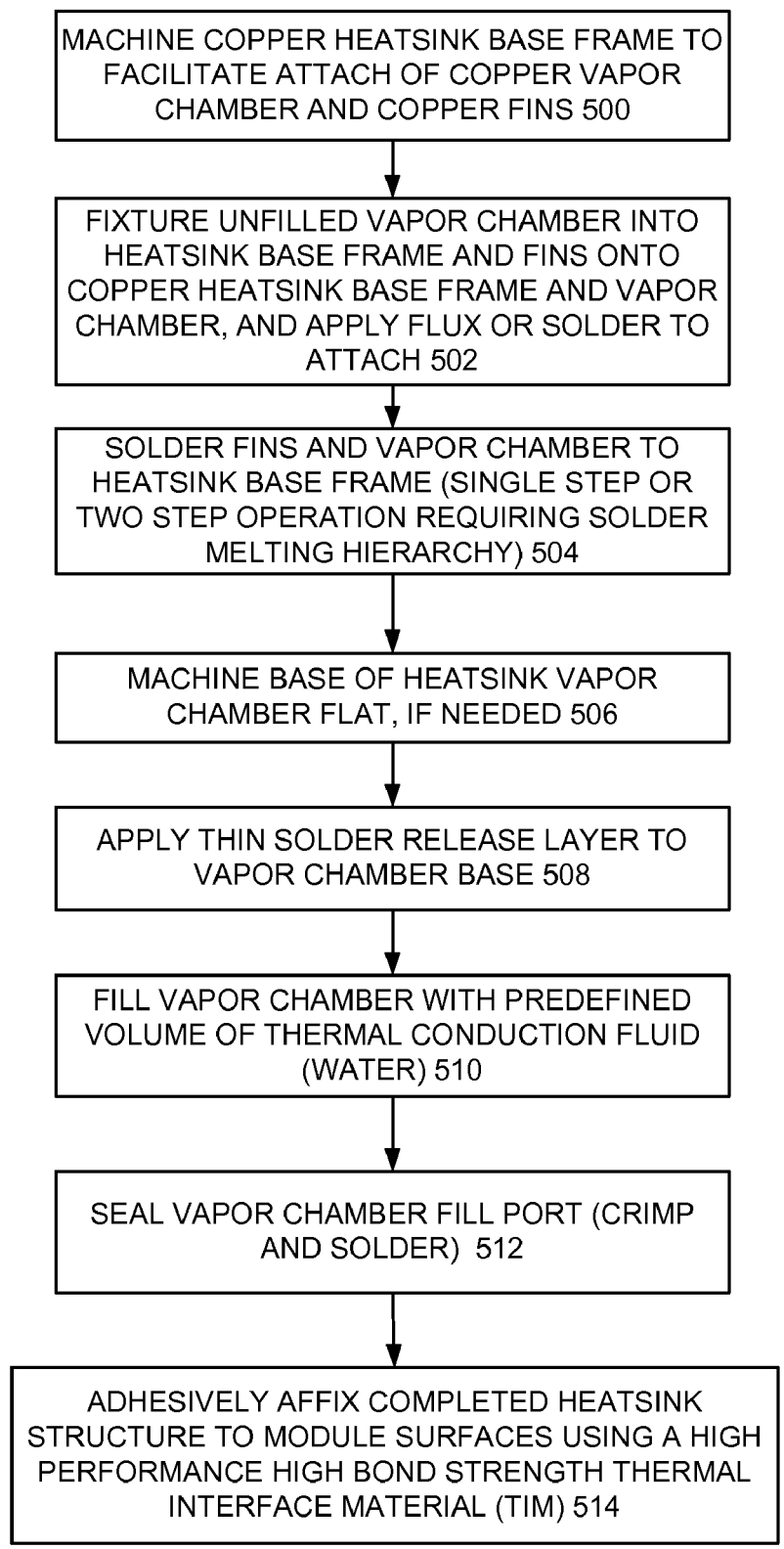

HIGH PERFORMANCE REWORKABLE HEATSINK AND PACKAGING STRUCTURE WITH SOLDER RELEASE LAYER AND METHOD OF MAKING

This application is a divisional application of Ser. No. 11/316,264 filed on Dec. 22, 2005.

FIELD OF THE INVENTION

The present invention relates generally to the data processing field, and more particularly, relates to a high performance reworkable heatsink and packaging structure with solder release layer and a method of making the high performance reworkable heatsink and packaging structure.

DESCRIPTION OF THE RELATED ART

U.S. Pat. No. 6,084,775 to Bartley et al, issued Jul. 4, 2000, and assigned to the present assignee, discloses heatsink and package structures with a fusible release layer. Aluminum heatsinks are plated with a solderable layer and are overplated with a solder release layer. The release layer comprises a tin-lead-indium alloy. The heatsinks are mounted on individual IC modules or banks of IC modules that are interconnected to a printed circuit card. A mechanically compliant, thermally conductive adhesive is used to join the heatsinks to the modules. An oxide formed on the release layer readily bonds with the thermally conductive adhesive. In the event that heatsinks need to be removed to repair or rework the modules, local heat may be applied to melt the release layer to remove a heatsink without need for use of significant applied torque and normal forces. Because the release layer has a low melting point that affords easy separation from the adhesive layer, both component delaminations and the partial reflow or melting of solder joints on adjacent components are eliminated from the heatsink removal process.

Today high performance semiconductor modules have increased demands for the cooling of the semiconductor die in the module. As a result, exotic, complicated and thus expensive thermal solutions are being implemented in the industry.

Many of the current solutions require the use of very fragile, extremely thin thermal interface material bondlines that thermally couple complex cooling devices, such as heatsinks possessing vapor chambers or integral heatpipes to the electronic component to maximize cooling efficiency.

One major problem with the current solutions is that the thermal interface between cooling device and electronic component is very thin and very weak. Because of this thin bondline geometry and the lack of intrinsic strength of high performance bondline materials, very high stresses on the thermal interfaces can result and make these materials prone to material movement, which ultimately leads to thermal degradation and device failure.

To circumvent these issues high bond strength, thin bondline thermal interface adhesives can be used but their bonds are typically permanent and due to lack of reworkability, do not allow for manufacturability packaging configuration to be established.

It is therefore very desirable to create a packaging structure, which facilitates creation of a high performance high reliable thermal interface structure that is also readily separable in order to facilitate module and circuit board repair.

SUMMARY OF THE INVENTION

Principal aspects of the present invention are to provide a high performance reworkable heatsink and packaging structure with solder release layer and method of making the structure. Other important aspects of the present invention are to provide such high performance reworkable heatsink and packaging structure with solder release layer and method of making the structure substantially without negative effect and that overcome many of the disadvantages of prior art arrangements.

In brief, a method of making and a high performance reworkable heatsink and packaging structure with solder release layer are provided. A heatsink structure includes a heatsink base frame. A selected one of a heatpipe or a vapor chamber, and a plurality of parallel fins are soldered to the heatsink base frame. A solder release layer is applied on an outer surface of the heatsink base frame. The solder release layer has a lower melting temperature range than each solder used for securing the selected one of the heatpipe or the vapor chamber, and the plurality of parallel fins to the heatsink base frame. After the solder release layer is applied, the heatpipe or the vapor chamber is filled with a selected heat transfer media.

In accordance with features of the invention, solder release layer has a lower melting temperature range than other higher melting point solders used for attaching the heatpipe or the vapor chamber, and the plurality of parallel fins to the heatsink base frame. The higher melting point solders include, for example, a selected one of Sn—Pb alloys or Pb-Free alloy compositions typically used for surface mount technology (SMT) assembly such as Sn-rich Sn—Cu—Ag solder compositions. The solder release layer is a relatively thin layer, and is applied by a selected one of solder fountain, wave solder, or selective solder plating operations. The vapor chamber and the heatpipe are copper brazed units, optionally including Nickel plating. The heatsink base frame and fins are formed of copper. The heatsink structure is attached to the module structure using a high performance high adhesive bond strength thermal interface material (TIM) applied between the solder release layer and the module structure.

BRIEF DESCRIPTION OF THE DRAWINGS

The present invention together with the above and other objects and advantages may best be understood from the following detailed description of the preferred embodiments of the invention illustrated in the drawings, wherein:

FIG. 5 is a flow diagram illustrating exemplary steps for making the high performance reworkable a high performance reworkable heatsink and packaging structure of FIG. 3 including the heatsink structure of FIG. 1 in accordance with the preferred embodiment.

DETAILED DESCRIPTION OF THE PREFERRED EMBODIMENTS

In accordance with features of the preferred embodiments, a solder release layer is created on a vapor chamber or heatpipe heatsink structure. This release layer interface material must be compatible with all fabrication requirements and attach operations incorporated into the heatsink structures and requires selection of a release solder material with suitable melting hierarchy relative to the chamber, heatpipe and fin attach operations used to create the heatsink component and also has adequate working range in solid state to afford reliable interface formation with the electronic component to which the heatsink structure is attached and compatibility with the balance of interconnects present that are used to affix the module to the circuit board as well.

Figure 1:
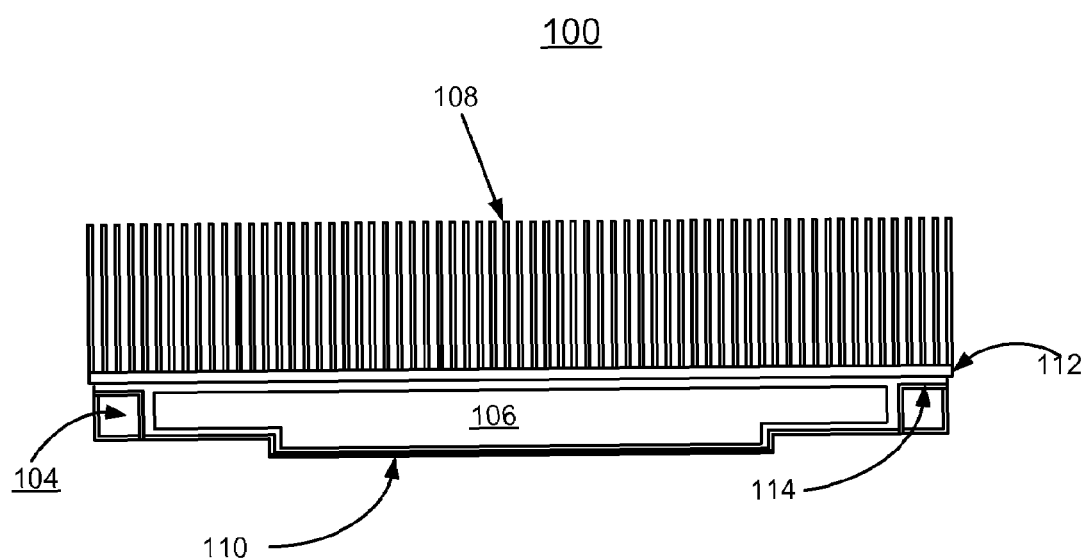
FIG. 1 is a schematic and sectional side view not to scale of an exemplary heatsink structure including a vapor chamber in accordance with one preferred embodiment.
Figure 2:
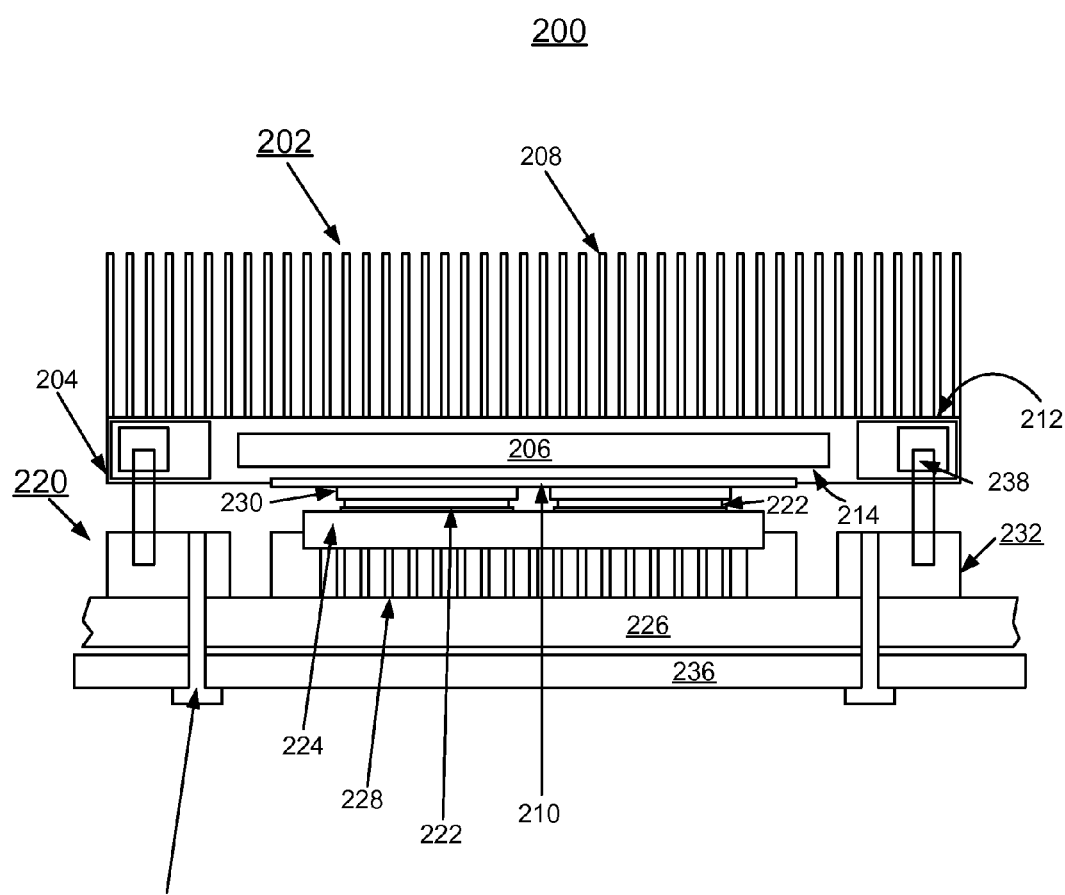
FIG. 2 is a schematic and sectional side view not to scale of an exemplary high performance reworkable heatsink and packaging structure including a heatpipe in accordance with another preferred embodiment.
Figure 3:
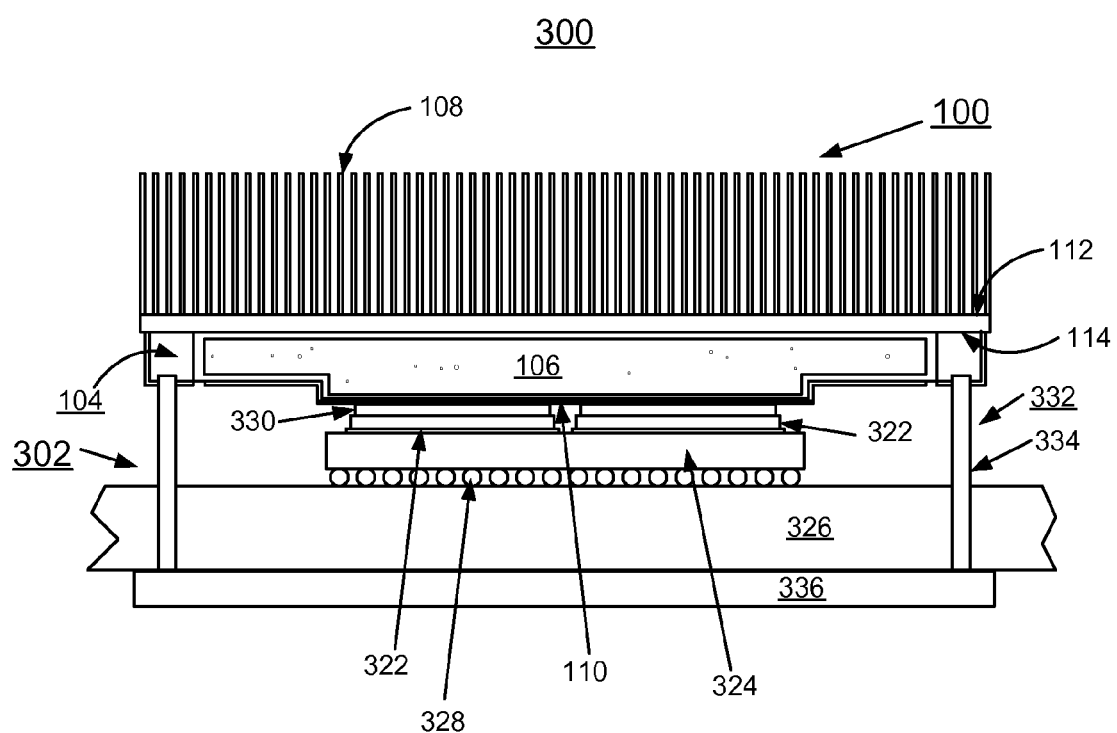
FIG. 3 is a schematic and sectional side view not to scale of an exemplary high performance reworkable heatsink and packaging structure including the high performance reworkable heatsink structure of FIG. 1 in accordance with one preferred embodiment.

In accordance with features of the preferred embodiments, after creation of the heatsink structure the heatsink is placed and attached onto an electronic module device surface using a high performance high adhesive bond strength thermal interface material (TIM) present between the solder release layer on the bottom of the heatsink and the module/die. If removal of the heatsink is desired, the assembly is heated sufficiently in order to drive melting of the solder release layer on the heatsink to allow removal of the heatsink from the adhesive TIM bondline. An exemplary preferred vapor chamber heatsink structure is illustrated in FIG. 1. Also as shown in FIG. 2 an exemplary heatsink and packaging structure includes a heatpipe heatsink structure mechanically affixed using a Non-Influencing Fastener (NIF) hardware configuration. Also as shown in FIG. 3 an exemplary heatsink and packaging structure includes the vapor chamber heatsink structure of FIG. 1.

Having reference now to the drawings, in FIG. 1, there is shown an exemplary heatsink structure generally designated by the reference character 100 in accordance with one preferred embodiment. Heatsink structure 100 includes a heatsink base frame 104, a vapor chamber 106 of the preferred embodiment, and a plurality of parallel fins 108. A solder release layer 110 is formed on an outer or lower surface of the heatsink structure 100.

The solder release layer 110 of the high performance heatsink structure 100 enables removal of the heatsink structure or enables reworkability. The solder release layer 110 is applied after first building the heatsink base frame 104 and attaching the vapor chamber 106 and the fins 108 to the heatsink base frame 104. The heatsink base frame 104, the vapor chamber 106 and the fins 108 typically are formed of copper. The Cu brazed vapor chamber 106 optionally includes Ni plating. A Ni plated Al frame can be used for the heatsink base frame 104.

First attaching steps include soldering the vapor chamber 106 to the heatsink base frame 104 using a selected solder 114 and soldering the fins 108 to the heatsink base frame 104 and top surface of vapor chamber 106 using a selected solder 112. This is accomplished using either a single solder attached operation or a hierarchical two step soldering operation by using higher melting point solders such as Sn—Pb alloys or Pb-Free alloy compositions typically used for surface mount technology (SMT) assembly such as Sn-rich Sn—Cu—Ag solder compositions.

Referring now to FIG. 2, there is shown an exemplary high performance reworkable heatsink and packaging structure generally designated by the reference character 200 in accordance with another preferred embodiment. High performance reworkable heatsink and packaging structure 200 includes a heatsink structure generally designated by 202.

Heatsink structure 202 includes a heatsink base frame 204, a heatpipe 206, and a plurality of parallel fins 208. A low melting point solder release layer 210 is formed on a lower surface of the heatsink base frame 204. Similar operations also are used in the construction of the heatsink structures 202 possessing heatpipes 206 instead of vapor chambers 106 of the high performance heatsink structure 100. The fins 208 are soldered to the heatsink base frame 204 using a selected solder 212 and the heat pipes 206 are soldered into the heatsink base frame 204 using a selected solder 214. The heatsink base frame 204, the heatpipe 206 and the fins 208 typically are formed of copper. The Cu brazed heatpipe 206 optionally includes Ni plating. The heatsink base frame 204 can be copper or Ni plated Al.

In accordance with features of the preferred embodiments, after the bulk heatsinks 100 and 202 are made and possess embedded, soldered in vapor chambers 104 or heatpipes 206, and also have solder attached fins 108, 208 in position, the low melting point solder release layer 110, 210 is applied to all, or a portion of the heatsink base frame 104, 204. This release layer 110, 210 is typically very thin, for example less than 10 microns, and can be applied in a number of ways including solder fountain, wave solder, or selective solder plating operations. In some instances it may also be desirable to have the heatsink base frame 104, 204 preplated with a barrier material such as Ni to prevent long term elevated temperature base metal-to-solder release layer interdiffusion.

Various solder release layer candidate materials including various suitable alloy candidates having melting ranges in the general vicinity of 117-125° C. form the solder release layer 110, 210, including multiple alloys manufactured and sold by Indium Corporation of America, and designated by Indalloy numbers. For example, an Indalloy number 1 including 50/50 wt % Sn—In alloy and a Melting range of 118-125° C. can form the solder release layer 110, 210. Another example, an Indalloy number 67 including 58/42 wt % Bi—Pb alloy and a melting range (MR) of 124-126° C. can form the solder release layer 110, 210. Other suitable alloy candidates for the solder release layer 110, 210 having a set melting range in a selected temperature range between 117-133° C. include:

Indalloy numbers 13 a 70/15/9.6/5.4 wt % In—Sn—Pb—Cd alloy MR 125° C.;

Indalloy numbers 62 a 55/44/1 wt % Bi—Pb—Sn alloy MR117-126° C.;

Indalloy numbers 64 a 55/44/1 wt % Bi—Pb—Sn alloy MR120-121° C.;

Indalloy numbers 70 a 40/40/20 wt % In—Sn—Pb alloy MR121-130° C.;

Indalloy numbers 71 a 52/48 wt % Sn—In alloy MR118-131° C.;

Indalloy numbers 73 a 58.84/41.16/2 wt % Bi—Sn—Pb alloy MR128-133° C.;

Indalloy numbers 255 a 55.5/44.5 wt % Bi—Pb alloy MR124° C.;

Indalloy numbers 1E a 52/48 wt % In—Sn alloy MR118° C.

After the solder release layer 110, 112 is applied, the vapor chamber 106 of the heatsink structure 100 and heatpipe 206 of the heatsink structure 202 are then filled with suitable heat transfer media, typically water and are then sealed, for example, using a local brazing operation.

In accordance with features of the preferred embodiments, the heatsink structures 100, 202 are completed and then adhesively affixed to module surfaces using a high performance high adhesive bond strength thermal interface material (TIM). If additional strain relief is required to support the heatsink and mechanical hardware surrounding the packaging it is added thereafter, rendering for example respective structures 200, 300 as shown in FIGS. 2 and 3.

High performance reworkable heatsink and packaging structure 200 includes an associated module structure 220 including one or more electronic module devices 222 carried by one or more modules 224 mounted to a printed circuit board 226, for example, by a plurality of connection pins, such as solder columns 228. The heatsink structure 202 is attached to the chip surface of module devices 222 using a high performance high adhesive bond strength thermal interface material (TIM) 230 present between the bottom of the heatsink structure 202 and the module device or chip die 222. A load frame arrangement generally designated 232 located between the printed circuit board 226 and the heatsink structure 202 positions and retains the heatsink structure. A plurality of screws 234 fasten the load frame arrangement 232 and a stiffener member 236 to the printed circuit board 226. The heatpipe heatsink structure 202 is mechanically affixed to the load frame arrangement 232 using a Non-Influencing Fastener (NIF) hardware configuration of a plurality of fasteners 238.

Referring now to FIG. 3, there is shown an exemplary high performance reworkable heatsink and packaging structure generally designated by the reference character 300 in accordance with one preferred embodiment. High performance reworkable heatsink and packaging structure 300 includes the high performance reworkable heatsink structure 100 of FIG. 1 and an associated module structure 302. High performance reworkable heatsink and packaging structure 300 includes one or more electronic module devices 322 carried by one or more modules 324 mounted to a printed circuit board 326, for example, by a ball grid array (BGA) 328. The heatsink structure 100 is attached to the chip surface of module devices 322 using a high performance high adhesive bond strength thermal interface material (TIM) 330 present between the bottom of the heatsink structure 100 and the module device or chip die 322. A mechanical fastening arrangement generally designated 332 is located between the printed circuit board 326 and consists of a plurality of alignment posts 334 affixed to the heatsink base frame 104, extending through the printed circuit board 326, and attached to a stiffener member 336.

Figure 4:
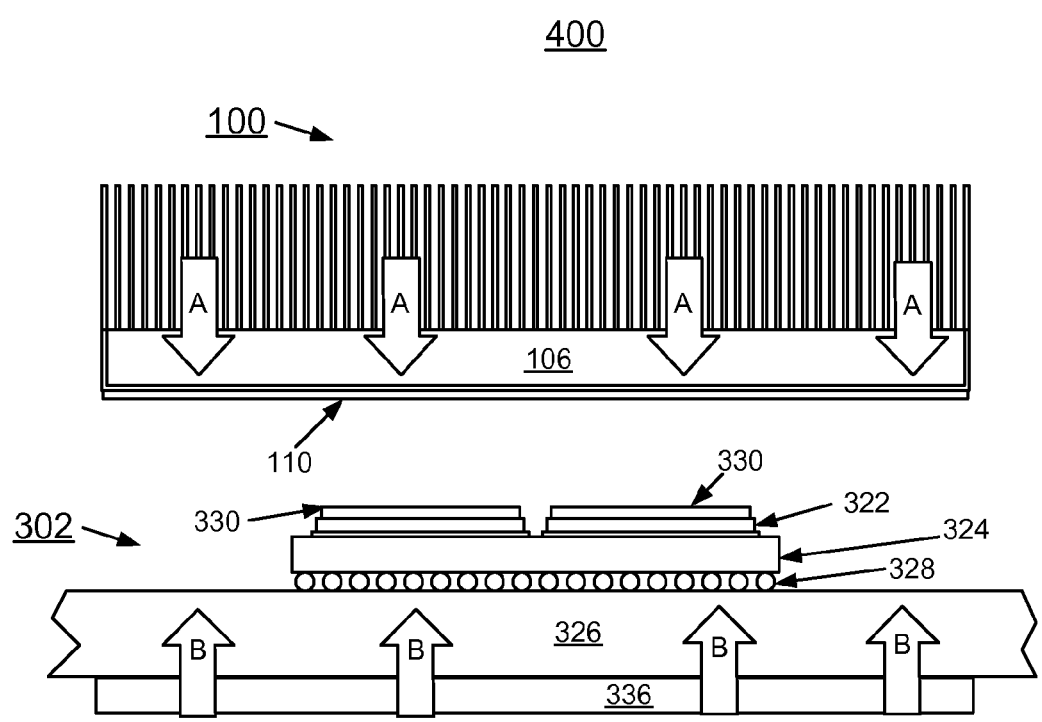
FIG. 4 is a schematic and sectional side view not to scale illustrating local heat application to the high performance reworkable heatsink and packaging structure of FIG. 2 or FIG. 3 in accordance with one preferred embodiment.

FIG. 4 schematically illustrates local heat application generally designated by the reference character 400 with a high performance reworkable heatsink 100 and module structure 302. Local heat application 400 is indicated by a plurality of arrows respectively labeled A and B for heatsink removal when required, for example, to facilitate either reapplication or module removal from the board. The assembly is heated to a temperature above which the solder release layer 110 melts, such that debonding of the high performance high adhesive bond strength TIM 330 can occur.

Referring now to FIG. 5, there are shown exemplary steps for making the high performance reworkable heatsink and packaging structure, for example, structures 200, 300 as shown in FIGS. 2 and 3 in accordance with the preferred embodiments. It should be understood that for simplicity the vapor chamber heatsink structure 100 only is described, while the same fabrication method equally applies to the heatpipe heatsink structure 204.

As indicated in a block 500, first copper Heatsink (HS) base frame 104 is machined to facilitate attach of copper vapor chamber 106 and copper fins 108. Next the step is to fixture unfilled vapor chamber 106 into HS base frame 104 and fins 108 onto the copper HS base frame 104 and vapor chamber 106 as indicated in a block 502. Then a next step is to apply flux or solder to attach as indicated in a block 504.

The attach step at block 504 can be a 1 or 2 step operation. The vapor chamber 106 can be formed of copper, or nickel plated copper.

The single step operation to solder fins 108 and vapor chamber 106 to base frame 104 includes mounting fins 108 and chamber 106 simultaneously to base using solders with melting characteristics ranging from approximately 180-260 C. Solder 112, 114 used to simultaneously attach fins 108 and chamber 106 can be a variety of alloys such as:

a. 70/30 wt % Sn—Pb alloy having a melting range 183-257° C.;
b. eutectic Sn—Pb (63-37%) MP 183° C., or 60/40 Sn—Pb Solder having a melting range approximately 183-190° C.;
c. Pb-Free Alloy such as 95% Sn, 4% Ag 1% Cu having a melting range approximately 217-225° C.;
d. Pb-Free Alloy such as 89% Sn, 8% Zn, 3% Bi having a melting range approximately 190-197° C.

The two step operation requires solder melting hierarchy where first to mount or solder the vapor chamber 106 into the HS base frame 104 uses the solder (a.) 70/30 wt % Sn—Pb, (melting range 183-257° C.); or for Pb-Free Attach use solder (c.) Pb-Free Alloy such as 95% Sn, 4% Ag 1% Cu having the melting range approximately 217-225° C. Second the fins 108 are attached to base frame 104 after the vapor chamber 106 has been attached to base with the fin attach using solder (b.) eutectic Sn—Pb (63-37%) MP 183° C., or 60/40 Sn—Pb Solder having a melting range approximately 183-190° C.; or for Pb-Free Attach use solder (d.) Pb-Free Alloy such as 89% Sn, 8% Zn, 3% Bi having a melting range approximately 190-197° C.

A next optional step is to machine flat the base of heatsink vapor chamber 106, if necessary if the vapor chamber base 106 is not sufficiently flat as indicated in a block 506.

Then the thin solder release layer 110 is applied to vapor chamber base or outer surface of heatsink structure 100 as indicated in a block 508. The thin solder release layer 110 is, for example, a 50/50 wt % Sn—In alloy with a melting range of 118-125 C. The thin solder release layer 110 can be applied by fixturing heatsink structures 100 onto a wave solder machine equipped with an air knife to blow off excess solder or can be applied with a solder pot or fountain and squeegee for removal of bulk materials to provide the thin solder release layer coating.

As indicated in a block 510, then the vapor chamber 106 is filled with appropriate volume of thermal conduction fluid, typically water. Then the vapor chamber fill port is sealed as indicated in a block 512, for example, crimped and soldered or sealed using local heating and local solder application using a selected solder, where any of above example solders will work. This completes the vapor chamber heatsink structure 100. Then the vapor chamber heatsink structure 100 is attached to the module structure 302 to complete the high performance reworkable heatsink and packaging structure 300 as indicated in a block 514.

While the present invention has been described with reference to the details of the embodiments of the invention shown in the drawing, these details are not intended to limit the scope of the invention as claimed in the appended claims.

What is claimed is:

1. A method of making a high performance reworkable heatsink and packaging structure comprising the steps of:
    forming a heatsink structure for attachment to a module structure; forming said heatsink structure including providing a heatsink base frame;
    soldering a selected one of a heatpipe or a vapor chamber to said heatsink base frame, soldering a plurality of parallel fins to said heatsink base frame; and applying a solder release layer on at least a portion of an outer surface of said heatsink structure; said solder release layer having a lower melting temperature range than each solder used for attaching said selected one of said heatpipe or said vapor chamber, and said plurality of parallel fins to said heatsink base frame; and attaching said heatsink structure to said module structure using a high performance high adhesive bond strength thermal interface material (TIM) applied between said solder release layer and said module structure.

2. A method of making a high performance reworkable heatsink and packaging structure as recited in claim 1 includes the steps of filling said selected one of a heatpipe or a vapor chamber with a predefined volume of a thermal conduction fluid after said solder release layer is applied.

3. A method of making a high performance reworkable heatsink and packaging structure as recited in claim 1 wherein applying said solder release layer includes selecting a solder alloy having a selected melting range between 117-133° C.

4. A method of making a high performance reworkable heatsink and packaging structure as recited in claim 1 wherein the steps of soldering said selected one of a heatpipe or a vapor chamber to said heatsink base frame and soldering said plurality of parallel fins to said heatsink base frame includes selecting a solder alloy having a selected melting range between 183-257° C.

5. A method of making a high performance reworkable heatsink and packaging structure as recited in claim 4 includes selecting said solder alloy from one of:
   a. 70/30 wt % Sn—Pb alloy having a melting range 183-257° C.;
   b. eutectic Sn—Pb (63-37%) melting point approximately 183° C., or 60/40 Sn—Pb solder alloy having a melting range approximately 183-190° C.;
   c. Pb-Free alloy of 95% Sn, 4% Ag 1% Cu having a melting range approximately 217-225° C.; and
   d. Pb-Free Alloy of 89% Sn, 8% Zn, 3% Bi having a melting range approximately 190-197° C.

6. A method of making a high performance reworkable heatsink and packaging structure as recited in claim 4 includes selecting a first one of said solder alloys for soldering said selected one of a heatpipe or a vapor chamber to said heatsink base frame; and selecting a second one said solder alloys for soldering said plurality of parallel fins to said heatsink base frame.

7. A method of making a high performance reworkable heatsink and packaging structure as recited in claim 1 wherein applying said solder release layer includes applying a thin solder release layer having a thickness less than 10 microns.

* * * * *